United States Patent
Hwang et al.

(10) Patent No.: US 6,283,746 B1
(45) Date of Patent: Sep. 4, 2001

(54) METHOD FOR PURGING FURNACE TO DECREASE PARTICLE POLLUTION IN BAKING PROCESS

(75) Inventors: Paul Hwang; Eddy Wu, both of Hsin-Chu; Colin Chung, Chu-Pei; Bruce Han, Taipei, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/643,059

(22) Filed: Aug. 21, 2000

(51) Int. Cl.[7] .................................................. B08B 9/06
(52) U.S. Cl. ............................. 432/2; 134/22.11; 34/437
(58) Field of Search ........................... 432/2; 134/2, 3, 134/22.11, 22.12, 26, 28, 30, 34, 37; 34/437–439

(56) References Cited

U.S. PATENT DOCUMENTS 4,333,773 * 6/1982 Fjallstrom ....................... 134/22.12
5,546,890 * 8/1996 Tamaki et al. ................... 134/22.12
6,138,691 * 10/2000 Voloshin et al. ................. 134/22.11

* cited by examiner

Primary Examiner—Gregory Wilson

(57) ABSTRACT

An inside tube whose wall has oxide layer of impurities is provided, wherein the oxide layer is about 400K Å. The inside tube is washed with pure water by level-style washing. Then, taking the inside tube out and soaking it with hydrofluoric acid (HF). Next, the inside tube is taken out from hydrofluoric acid (HF) and it is soaked with pure water. It is dried with ammonia gas($NH_3$)after the inside tube is taken out from pure water. The inside tube is then washed with pure water by vertical-style washing, and it is dried with nitrogen gas ($N_2$). Finally, the purged inside tube is set into furnace, then proceed a baking process about two hours at low temperature and low pressure to eliminate entirely remained acid from the inside tube, wherein the foregoing temperature range is about between 120° C. to 400° C. and the foregoing pressure is about 0.3 torr. The baking process begins proceeding to follow the purged process has been finished.

20 Claims, 6 Drawing Sheets

METHOD FOR PURGING FURNACE TO DECREASE PARTICLE POLLUTION IN BAKING PROCESS

BACKGROUND OF THE INVENTION

1. Field of the Invention

The present invention relates generally to a furnace process, and more particularly to a method for purging furnace to decrease particle pollution in baking process.

2. Description of the Prior Art

Conventional furnace process takes advantage of heat convection and heat conduction principles to make the silicon wafer to reach heat balance with circumstances around the furnace so the temperature on control wafer can be exactly controlled, and the furnace can heat a great quantity of wafers at a time. It is able to reach the objective that reduce process time and cost for batch process.

However, conventional furnace process has some defect of itself. Because the furnace wall need to be heated to reach high temperature condition for long so the impurities are easy to deposit in the furnace and to pollute the wafers so that conventional furnace process is difficult to apply in the deep sub-micro process. Therefore, the pending problem that is the residual impurities are produced during the furnace process requires to be solved. Conventional method is used to wash the furnace, but the purge material is remained during the purge process, that result in the particle problem. Hence, conventional furnace process is becoming more and more difficult to control the pollutant source when the dimension of device is shrink gradually.

Cross-sectional view of the known prior art of the furnace process is illustrated in FIG. 1A. First of all, a wafer 110 is placed into a furnace boat 100 to perform a baking process, wherein the furnace boat 100 includes an external tube 130 having a material of quartz and an inside tube 140 having a material of silicon carbide-silicon (SIC—Si). The cap 120 makes the wafer 110 to rise into the furnace boat 100 and proceed with the baking process at the high temperature and the low pressure.

Referring to FIG. 1B, an oxide layer 160 of impurities is formed on the wall of the inside tube 140 during the baking process, wherein the oxide layer 160 will increase thickness of itself to follow the process. It is necessary to perform a purge step to eliminate the oxide layer 160 which form on the wall of the inside tube 140 when the thickness of the oxide layer 160 increase to be standard value which is set in the apparatus, such as 400 K Å. The purge step of above is performed by level-style washing using the water and hydrofluoric acid (HF), and using gas such as $NH_2$ to dry the inside tube 140, then, the inside tube 140 which has been purged is set into furnace boat 100. For avoiding inside tube wall 150 to be damaged by oxide layer 160 at high temperature thermo-oxide process, hence it is necessary to perform a pre-coating process so as to form a silicon nitride layer (SiN) 170 over the inside tube wall 150 of furnace 100 in advance before the furnace 100 enter into the baking process of the wafer. The pre-coating process of above performs to transport a mixing gas which consists of $SiH_2Cl_2$ (DCS) and ammonia ($NH_3$) into the furnace 100 at the environment of high temperature and low pressure, and it proceeds to deposit a silicon nitride layer 170 on the inside tube wall 150 by low pressure chemical vapor deposition (LPCVD), wherein the pre-coating process is operated for about 14 to 16 hours at the surroundings which is about 800° C. and 0.3 torr pressure. Wafer's baking process begins proceeding after the pre-coating process has been finished.

In according with the furnace purge process of above, it will result in follow problems. Referring to FIG. 2A, there are issues about remained acid after the inside tube has been cleaned, that is acid 220 will adhere to the silicon nitride coating layer 210 of the inside tube wall 200, wherein the remained acid 220 consists of water, hydrofluoric acid (HF) and $OH^-$. The remained acid 220 will etch and damage the silicon nitride coating layer 210 at about 800° C. during the pre-coating process of the inside tube is baked, as shown in FIG. 2B. If the silicon nitride coating layer 210 is etched over depth, the silicon nitride coating layer 210 of the inside tube 200 will produce slight breakages, and it will result in the silicon substrate (such as SIC—Si) of the inside tube 200 leak out, as shown in FIG. 2C. The hole 240 is formed when the silicon substrate of the inside tube wall 200 leak out for long, hence, the structure of the inside tube will be destroyed this issue, as shown in FIG. 2D.

In accordance with remained acid issues in the foregoing, two causes of the polluter for forming in the furnace process have been known: one of the particles 250 of pollution in the furnace process are chips which flakes off the silicon nitride coating layer 210 during the process; another of the particles 250 of pollution in the furnace process is silicon dioxide ($SiO_2$) which is formed by leaking out the silicon substrate of the inside tube at high temperature. Moreover, when a pre-coating process is performed in the inside tube at high temperature, a silicon nitride layer having holes which contains nitrogen is due to nitrogen which is transported into the furnace remains in the hole which is formed by leakage of the silicon substrate, wherein the silicon nitride layer 270 which contains nitrogen is not the silicon nitride layer 210 of process. Hence, there are difference two silicon nitride layers to form, and in consequence the silicon nitride layer 210 of process is not able to coat completely on the inside tube wall, as shown in FIG. 2E. Up to now there has been no effective method in the semiconductor industry to overcome issues of foregoing conventional process.

In accordance with the above description, a method for purging furnace to decrease particle polluter in baking process is therefore necessary, so as to raise the yield and quality of the follow-up process.

SUMMARY OF THE INVENTION

In accordance with the present invention, a method is provided for purging furnace to decrease particle polluter in baking process that substantially overcomes drawbacks of above mentioned problems arised from the conventional methods.

Accordingly, it is a main object of the present invention to provide a method for purging furnace to decrease particle polluter during baking process. This present invention performs a treatment of the furnace for eliminating remained acid to avoid destroying the inside tube during furnace process. Hence, particle issue of the foregoing can be solved by this method.

Another object of the present invention is to provide a method for avoiding adhering remained acid on the inside tube when the furnace is purged. This present invention takes advantage of improved method for washing furnace to decrease the remained acid that has adhered to inside tube. Hence, this present invention can effectively raise quality of the process.

Still another object of the present invention is to provide a method for avoiding adhering remained acid on the inside tube when the furnace is purged. This present invention performs a treatment with low temperature and low pressure to eliminate remained acid that adhered to inside tube before the pre-coating of baking process so 2-in-1 processes which have pre-coating and baking process with high temperature and low pressure can be substituted for this method.

In accordance with the present invention, a new method for purging furnace to decrease particle pollution in baking process is disclosed. First of all, a pre-purged inside tube whose wall has oxide layer of impurities is provided, wherein the oxide layer is about 400K Å. The inside tube is washed with pure water by level-style washing. Then, taking the inside tube out and soaking it with hydrofluoric acid (HF). Next, the inside tube is taken out from hydrofluoric acid (HF) and it is soaked with pure water. It is dried with ammonia gas (NH$_3$) after the inside tube is taken out from pure water. The inside tube is then washed with pure water by vertical-style washing, and it is dried with nitrogen gas (N$_2$). Finally, the purged inside tube is set into furnace, then proceed a baking process about two hours at low temperature and low pressure to eliminate entirely remained acid from the inside tube, wherein the foregoing temperature range is about between 120° C. to 400° C. and the foregoing pressure is about 0.3 torr. The baking process begins once to follow the purged process has been finished.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

A preferred embodiment of the present invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1A:
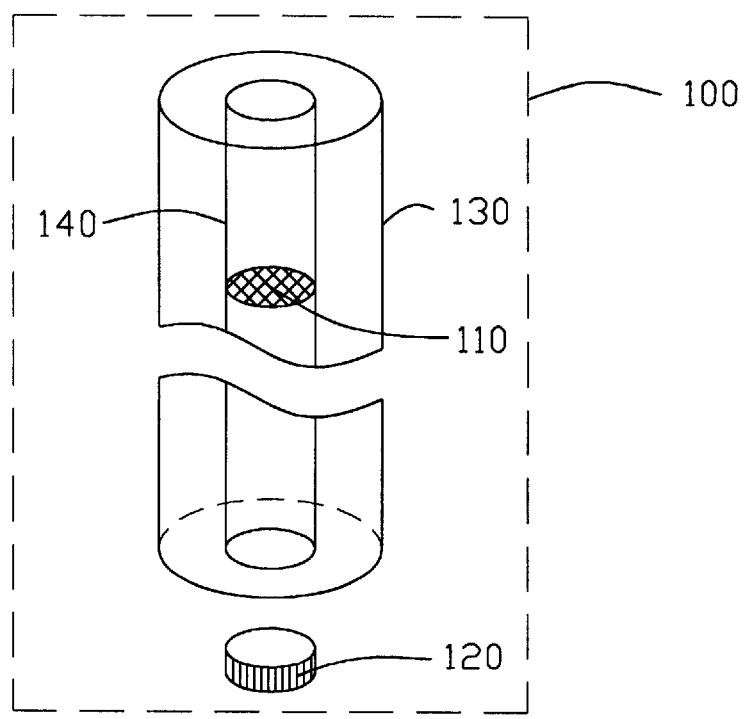
FIG. 1A shows cross-sectional views illustrative of the conventional furnace process.
Figure 1B:
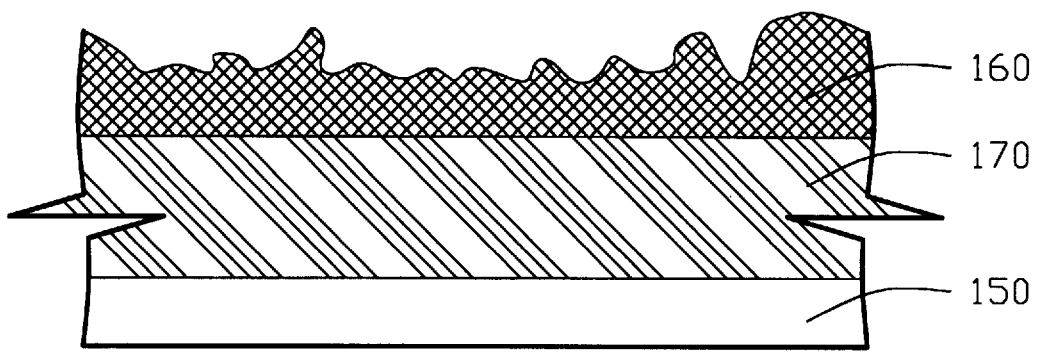
FIG. 1B shows cross-sectional views illustrative of forming oxide layer on the inside tube.
Figure 2A:
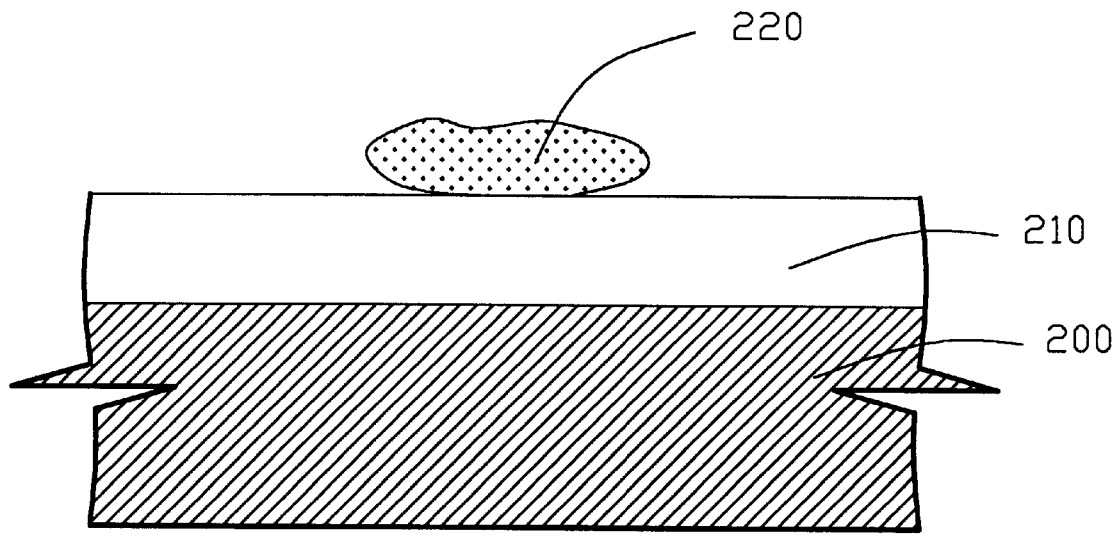
FIGS. 2A to 2E show cross-sectional views illustrative of remained acid that damages inside tube wall at high temperature to form particle polluter in the conventional furnace process.
Figure 2B:
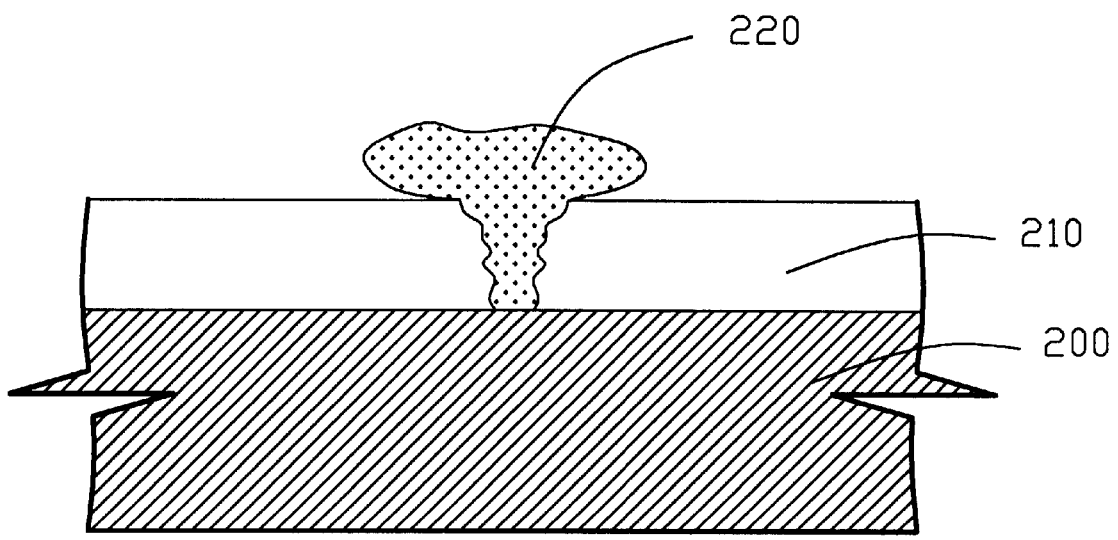
Figure 2C:
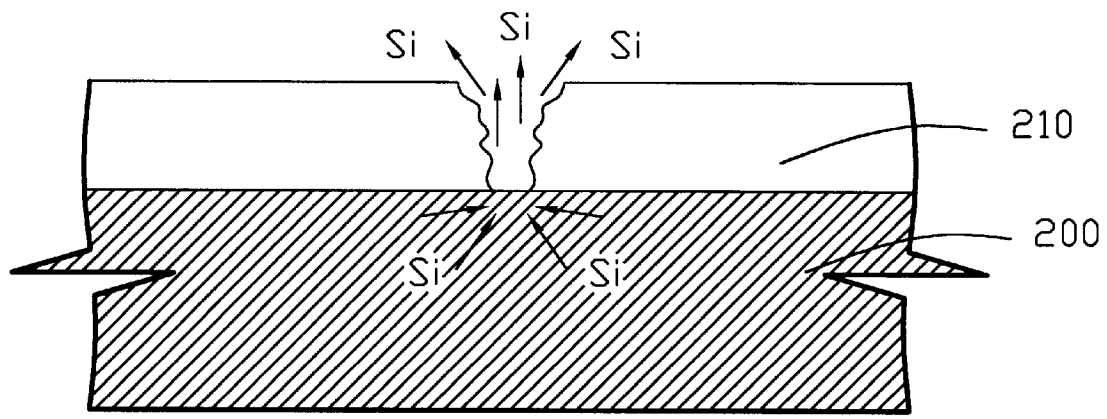
Figure 2D:
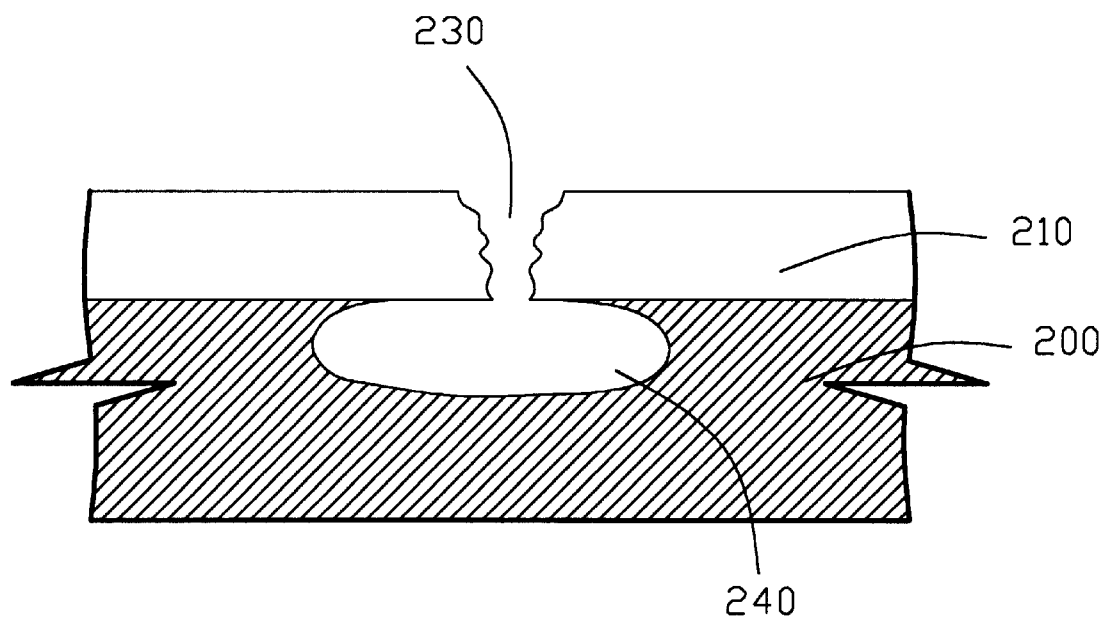
Figure 2E:
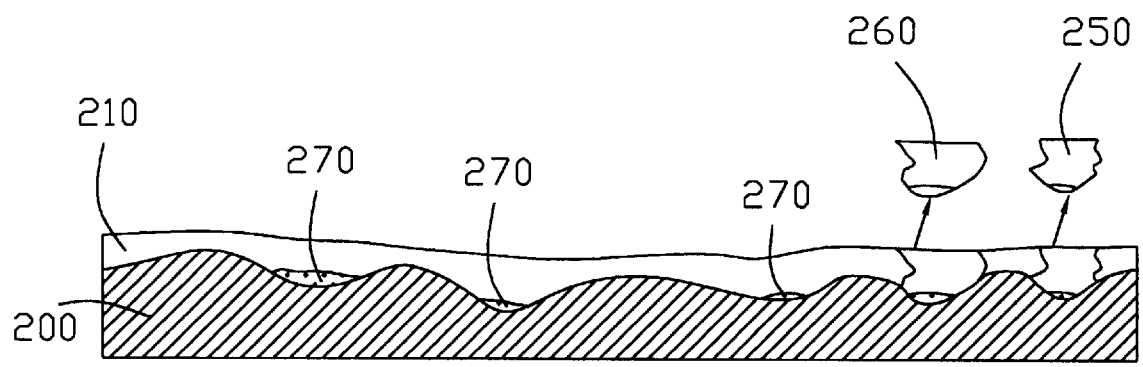
Figure 3:
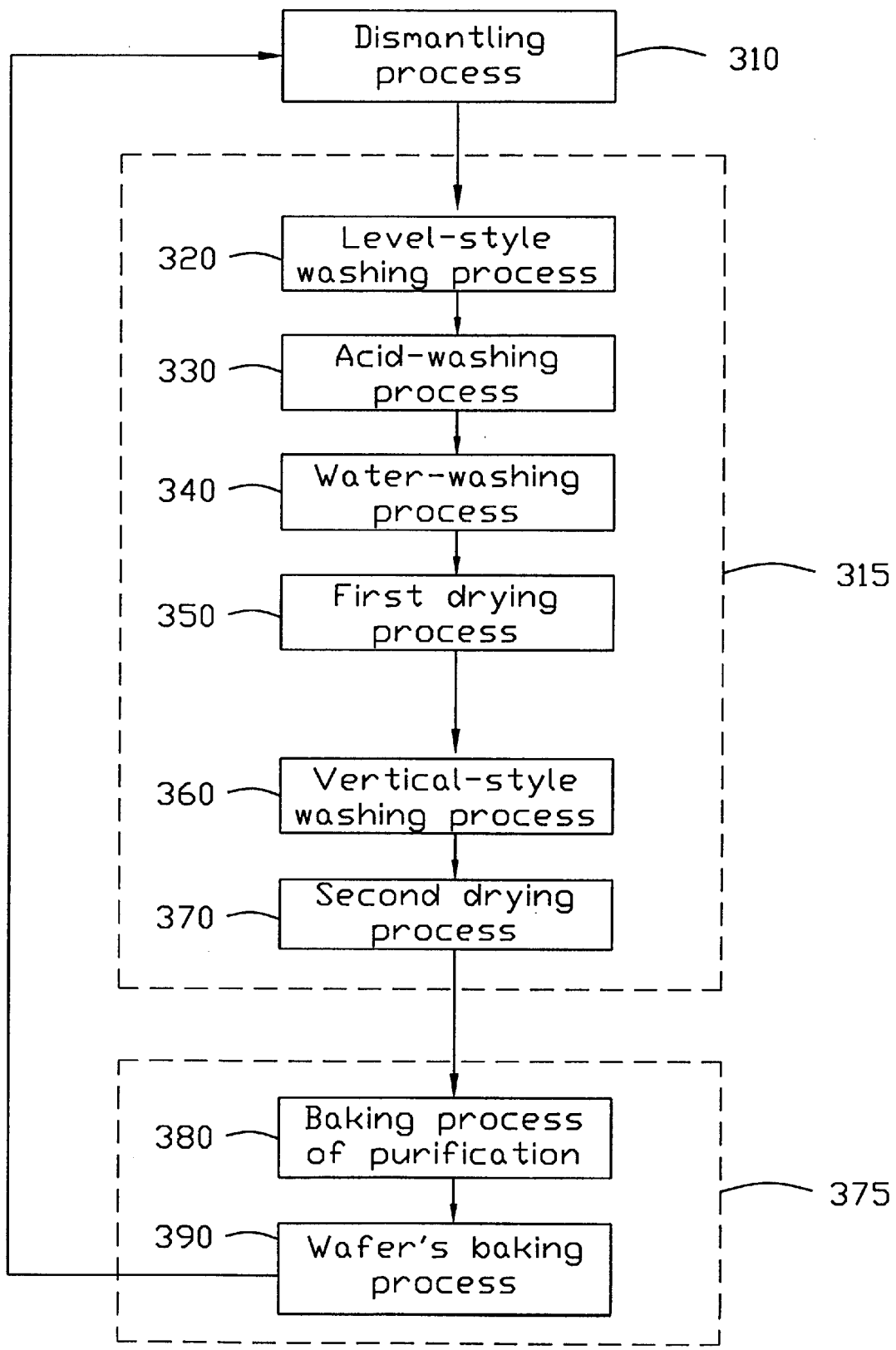
FIG. 3 shows flow chart illustrative of purged process in the present invention.

As illustrated in FIG. 3, in this embodiment, first of all, a pre-purged inside tube whose wall has oxide layer of impurities is dismantled from the furnace, wherein the oxide layer is about 400K Å, as shown in dismantling process 310. Then, a washing process 315 of purification is performed, that wash the inside tube with pure water by level-style washing 320.

Next, taking the inside tube out and soaking it about 6 hours with 49% concentration solution of hydrofluoric acid (HF) to perform a acid-washing process 330. The inside tube is then taken out from acid-washing process 330 and it is soaked with pure water to perform a water-washing process 340. The first drying process 350 is proceeded to dry the inside tube with the gas including amino-group, such as ammonia (NH$_3$), after the inside tube is taken out from water-washing process 340. The inside tube is then washed one hour with pure water by vertical-style washing process 360. The inside tube is then taken out from vertical-style washing process 360 to proceed a second drying process 370 with nitrogen gas (N$_2$).

Finally, the inside tube that has been purged is set into furnace to proceed a furnace process 375. A purgative baking process 380 is performed about two hours with low temperature and low pressure in advance for eliminating entirely remained acid from the inside tube, wherein the foregoing temperature range is about between 120° C. to 400° C. and the foregoing pressure is about 0.3 torr. Wafer's baking process 390 begins proceeding to follow the purged process has been finished. When the thickness of inside tube wall grow to 400K Å in wafer's baking process 390, it is necessary that begin proceeding to purge the inside tube from process 310.

Figure 4:
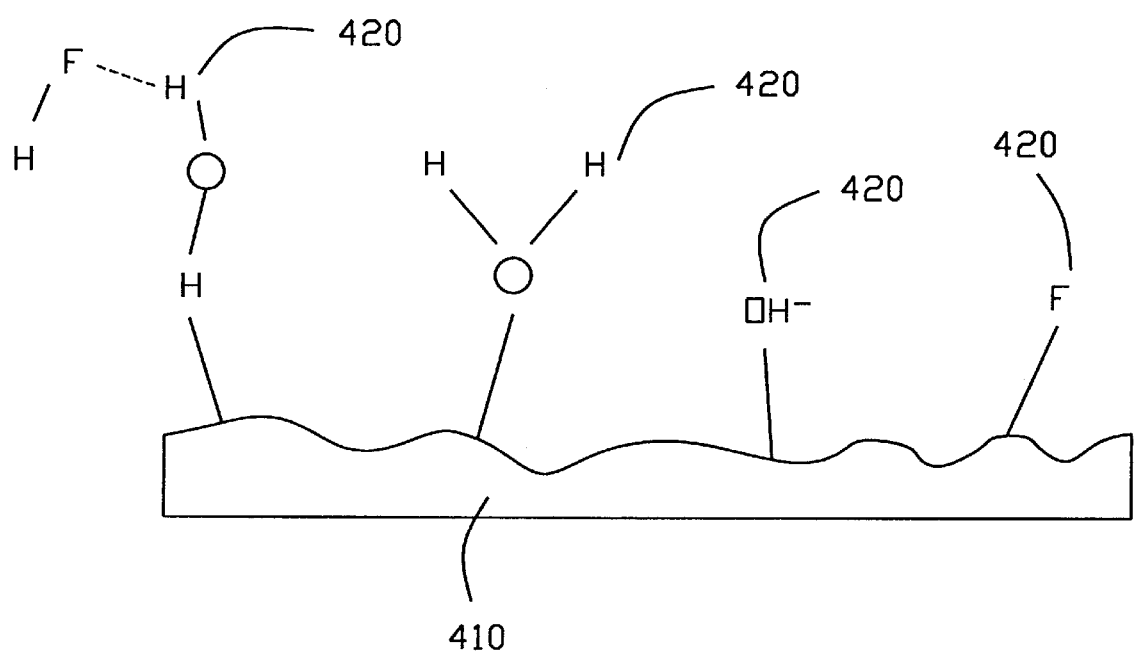
FIG. 4 shows cross-sectional views illustrative of remained acid on the furnace wall that is in conventional purged process.

In this embodiment of the present invention, a method for purging furnace to decrease particle pollution in baking process is provided. This present invention can eliminate remained acid to avoid destroying the inside tube during furnace process. For eliminating entirely the remained acid adhered to the inside tube, this method combines level-style washing with vertical-style washing process. Before the furnace process, it must perform a baking process with above 120° C., that is at low temperature and low pressure, due to the material 420 for purging, such as hydrofluoric acid (HF), water and oxyhydrogen-group (OH$^-$) etc. are still remained on the inside tube 410 during washing process, wherein the boiling point of hydrofluoric acid is about 120° C., the boiling point of water is about 100 ° C. and the boiling point of oxyhydrogen-group is about 108° C., as shown in FIG. 4. Hence, conventional 2-in-1 processes that have pre-coating and baking process with high temperature and low pressure can be substituted for this method.

In accordance with the experimental data of the present invention, there are three conditions can influence particle polluter during furnace process, such as the method for purging furnace, baking method and baking temperature. Hence, the best process for decreasing particle uses the washing method that combines level-style with vertical-style and operation at low temperature and low pressure are. What is more important, the baking time is shortened from about 14 hours to about 5 to 2 hours. The experimental data is shown as below table:

| Method | Temp | Time | Washing Method | Particle Check |
| --- | --- | --- | --- | --- |
| High Temp | 800° C. | 25 hr | Level | NG |
| | 600° C. | 20 hr | Level | NG |
| | 450° C. | 10 hr | Level | NG |
| Low Temp | 250° C. | 5 hr | Level + Vertical | OK |
| | 200° C. | 2 hr | Level + Vertical | OK |

The result is from the particle test of above table to know the best range of temperature is about 200° C. to 400° C., the best range of baking time is about 2 hours to 5 hours, and the best method of washing process is to combine level-style with vertical-style, wherein the word "NG" shows that amount of particle is greater than the standard valve. Hence, it is able to reach to purpose that economize on cost. Method of the present invention is the best purging furnace compatible process for deep sub-micro process.

Although specific embodiments have been illustrated and described, it will be obvious to those skilled in the art that various modifications may be made without departing from what is intended to be limited solely by the appended claims.

Obviously, many modifications and variations of the present invention are possible in light of the above teachings. It is therefore to be understand that within the scope of the appended claims, the present invention may be practiced otherwise than as specifically described herein.

What is claimed is:

1. A method for purging a furnace, said method comprising:

providing a inside tube;

performing a first cleaning process to eliminate a impure oxide layer from said inside tube;

taking said inside tube out from said first cleaning process to perform a first drying process;

performing a second cleaning process to eliminate remained solution of said first cleaning process from said inside tube; and taking said inside tube out from said second cleaning process to perform a second dry process.

2. The method according to claim 1, wherein said first cleaning process comprises a level washing process.

3. The method according to claim 1, wherein said second cleaning process comprises a vertical washing process.

4. A method for purging a furnace, said method comprising:

providing a inside tube;

performing a first cleaning process to wash said inside tube;

taking said inside tube out from said first cleaning process, and performing a second cleaning process to eliminate a impure oxide layer from said inside tube;

taking said inside tube out from said second cleaning process to perform a first drying process;

performing a third cleaning process to eliminate remained solution of said second cleaning process from said inside tube;

taking said inside tube out from said third cleaning process to perform a second drying process; and setting said inside tube into said furnace, and performing a baking process for purging said inside tube.

5. The method according to claim 4, wherein said first cleaning process comprises a level washing process.

6. The method according to claim 4, wherein said second cleaning process comprises an acid-washing process.

7. The method according to claim 4, wherein said second cleaning process comprises a water-washing process.

8. The method according to claim 4, wherein said third cleaning process comprises a vertical process.

9. The method according to claim 4, wherein the temperature of said baking process is greater than 120° C.

10. The method according to claim 4, wherein the operation time of said baking process is greater than 2 hours.

11. The method according to claim 4, wherein the pressure of said baking process is about 0.3 torr.

12. A method for purging a furnace, said method comprising:

providing a inside tube;

performing a level washing process to wash said inside tube;

taking said inside tube out from said level-style washing process to perform a acid-washing process;

taking said inside tube out from said acid-washing process to perform a water-washing process;

taking said inside tube out from said water-washing process to perform a first drying process;

performing a vertical washing process to wash said inside tube;

taking said inside tube out from said vertical-style washing process to perform a second drying process; and setting said inside tube into said furnace, and performing a baking process to purge said inside tube at temperature range about between 120° C. to 400° C., and operation time about between 2 hours to 5 hours.

13. The method according to claim 12, wherein said level washing process comprises pure water.

14. The method according to claim 12, wherein said acid-washing process comprises a process for soaking in a acid solution.

15. The method according to claim 14, wherein said acid solution comprises a hydrofluoric.

16. The method according to claim 12, wherein said water-washing process comprises a process for soaking in pure water.

17. The method according to claim 12, wherein said first drying process comprises an amino-group gas.

18. The method according to claim 12, wherein said vertical washing process comprises pure water.

19. The method according to claim 12, wherein said second drying process comprises a nitrogen gas.

20. The method according to claim 12, wherein the pressure of said baking process is about 0.3 torr.

* * * * *